United States Patent
Gennari Santori et al.

(10) Patent No.: US 12,483,446 B2
(45) Date of Patent: Nov. 25, 2025

(54) RECEIVER CIRCUIT, CORRESPONDING ISOLATED DRIVER DEVICE, ELECTRONIC SYSTEM AND METHOD OF DECODING A DIFFERENTIAL SIGNAL INTO A DIGITAL OUTPUT SIGNAL

(71) Applicant: STMicroelectronics International N.V., Geneva (CH)

(72) Inventors: Valerio Gennari Santori, Milan (IT); Carlo Curina, Bareggio (IT); Valerio Bendotti, Vilminore di Scalve (IT); Nicola De Campo, Cura Carpignano (IT)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/531,568

(22) Filed: Dec. 6, 2023

(65) Prior Publication Data

US 2024/0205055 A1    Jun. 20, 2024

(30) Foreign Application Priority Data

Dec. 20, 2022    (IT) .................... 102022000026067

(51) Int. Cl.
*H04L 25/02*  (2006.01)
*H03K 5/24*  (2006.01)

(52) U.S. Cl.
CPC ....... *H04L 25/0292* (2013.01); *H03K 5/2481* (2013.01); *H04L 25/0266* (2013.01); *H04L 25/0272* (2013.01)

(58) Field of Classification Search
CPC ............. H04L 25/0266; H04L 25/0272; H04L 25/0292; H04L 25/4902; H03K 3/013;
(Continued)

(56) References Cited

U.S. PATENT DOCUMENTS

| 4,835,486 A | 5/1989 | Somerville |
|---|---|---|
| 7,667,500 B1 | 2/2010 | Alfke |

(Continued)

FOREIGN PATENT DOCUMENTS

| EP | 1309144 A1 | 5/2003 |
|---|---|---|
| EP | 4383571 A1 | 6/2024 |

*Primary Examiner* — Young T. Tse
(74) *Attorney, Agent, or Firm* — Seed Intellectual Property Law Group LLP

(57) ABSTRACT

Provided is a receiver circuit that receives a differential signal including positive and negative spikes. A first comparator produces an intermediate set signal that includes a pulse at each positive spike of the differential signal, and a second comparator produces an intermediate reset signal that includes a pulse at each negative spike of the differential signal. A sensing circuit extracts a common-mode voltage signal from the differential signal and asserts a control signal when the amplitude of the common-mode voltage signal exceeds a threshold. A logic circuit asserts a masking signal for an interval in response to asserting the control signal and de-asserts the masking signal in response to the interval elapsing. The logic circuit produces a corrected set signal. The logic circuit produces a corrected reset signal. An output circuit generates an output signal from the corrected set signal and the corrected reset signal.

20 Claims, 6 Drawing Sheets

(58) Field of Classification Search
CPC .......... H03K 5/15; H03K 5/151; H03K 5/156;
H03K 5/2481; H03K 7/08; H03K 9/08
USPC ....... 375/238, 257, 258, 316, 317, 320, 340,
375/346; 329/312; 370/212; 455/501,
455/67.11, 67.13
See application file for complete search history.

(56) References Cited

U.S. PATENT DOCUMENTS

| | | | |
|---|---|---|---|
| 2010/0134185 A1* | 6/2010 | Liu | H03F 3/45475 |
| | | | 330/207 A |
| 2010/0315150 A1* | 12/2010 | Ochi | H03F 3/2173 |
| | | | 327/333 |
| 2013/0285634 A1* | 10/2013 | Bianco | H02M 3/157 |
| | | | 323/283 |
| 2013/0301690 A1* | 11/2013 | Shrestha | H04L 27/06 |
| | | | 375/340 |
| 2015/0180228 A1 | 6/2015 | Mills et al. | |
| 2018/0013353 A1* | 1/2018 | Nate | H02M 3/33523 |
| 2020/0266718 A1 | 8/2020 | Liu et al. | |
| 2022/0360894 A1 | 11/2022 | Carfore et al. | |
| 2022/0417076 A1* | 12/2022 | Bendotti | H04L 25/0272 |
| 2023/0170863 A1* | 6/2023 | Labbe | H03F 3/45475 |
| | | | 330/253 |
| 2023/0231504 A1* | 7/2023 | Kaliyannan | H02M 7/5387 |
| | | | 318/503 |

\* cited by examiner

RECEIVER CIRCUIT, CORRESPONDING ISOLATED DRIVER DEVICE, ELECTRONIC SYSTEM AND METHOD OF DECODING A DIFFERENTIAL SIGNAL INTO A DIGITAL OUTPUT SIGNAL

BACKGROUND

Technical Field

The description relates to isolated gate driver devices, which may be applied, for instance, in traction inverters, DC/DC converters, on-board chargers (OBC), and belt starter generators (BSG) for electric vehicles (EV) and hybrid electric vehicles (HEV).

Description of the Related Art

Conventional isolated gate driver devices are system-on-chip devices used to switch transistors (such as IGBT, SiC or Si MOSFET) in high-voltage motor control applications. Conventional isolated gate driver devices usually include two semiconductor dies arranged in the same package: a low-voltage die that exchanges signals with a microcontroller, and a high-voltage die that includes the driver circuit. The low-voltage die and the high-voltage die are electrically isolated one from the other by a galvanic isolation barrier, which usually includes one or more high-voltage capacitors (HVCap) arranged between the two dies.

FIG. 1 is a circuit block diagram exemplary of an isolated gate driver device. FIG. 2 is a time diagram including waveforms exemplary of signals in the device of FIG. 1, which illustrates possible operation of the device.

As exemplified in FIG. 1, an isolated gate driver device 10 includes a low-voltage semiconductor die 10a and a high-voltage semiconductor die 10b arranged in the same package. A communication channel is provided in the device 10, so that a (single-ended) pulse-width modulated (PWM) input signal $PWM_{IN}$ (also referred to as low-voltage transmission signal, e.g., a PWM signal having a frequency between 15 kHz and 5 MHz received from a microcontroller) received at an input pin 101 of the low-voltage die 10a can be propagated as a (single-ended) PWM output signal $PWM_{OUT}$ (also referred to as high-voltage reception signal) produced at an output pin 106 of the high-voltage die 10b. In certain applications, the communication channel may be bi-directional, so that a (single-ended) PWM input signal (also referred to as high-voltage transmission signal) received at an input pin of the high-voltage die 10b—not visible in FIG. 1—can be propagated as a (single-ended) PWM output signal (also referred to as low-voltage reception signal) transmitted by an output pin of the low-voltage die 10a—also not visible in FIG. 1.

In particular, the low-voltage die 10a includes a transmitter circuit 102 coupled to the input pin 101 and configured to convert the received single-ended signal $PWM_{IN}$ into a pair of differential PWM signals $OUT_P$, $OUT_N$. For instance, signal $OUT_P$ may be generated at the output of a buffer circuit that receives signal $PWM_{IN}$ at input, and signal $OUT_N$ may be generated at the output of another buffer circuit that receives the complement (e.g., an inverted replica) of signal $PWM_{IN}$ at input (e.g., an inverting buffer). The low-voltage die 10a further includes a first high-voltage capacitor 103P (e.g., an isolation capacitor) having a first terminal coupled to the first output of the transmitter circuit 102 to receive signal $OUT_P$, and a second high-voltage capacitor 103N (e.g., an isolation capacitor) having a first terminal coupled to the second output of the transmitter circuit 102 to receive signal $OUT_N$. The second terminals of the capacitors 103P and 103N provide the output nodes of the low-voltage die 10a, which are electrically connected (e.g., via bonding wires) to the input nodes of the high-voltage die 10b. The signals $OUT_P$, $OUT_N$ are thus filtered by the isolation capacitors 103P, 103N (acting as a high-pass filter) so that a pulsed differential signal Vd reaches the high-voltage die 10b. Additionally, the transmitter circuit 102 may implement a "gate retry" mechanism: the PWM input signal $PWM_{IN}$ is clocked by a clock signal CLK available in the low-voltage die 10a and having a frequency higher than the frequency of signal $PWM_{IN}$ (e.g., five times higher, ten times higher, or more), so that a spike is generated in the differential signal Vd at each edge of the clock signal CLK in order to facilitate recovering from possible pulse missing and allow correct reconstruction of signal $PWM_{IN}$ at the receiver side. The differential signal Vd thus includes a train of temporized spikes (positive and negative) corresponding to the edges of the input signal $PWM_{IN}$ and the edges of the clock signal CLK, with the sign of these spikes being dependent on the value of the input signal $PWM_{IN}$, as exemplified in FIG. 2. In particular, when the input signal $PWM_{IN}$ has a high logic value (logic '1') the spikes of signal Vd are positive, and when the input signal $PWM_{IN}$ has a low logic value (logic '0') the spikes of signal Vd are negative.

The high-voltage die 10b includes a receiver circuit 104 coupled to the input nodes of die 10b to receive the differential signal Vd, and configured to produce a reconstructed PWM signal $PWM_{RX}$ as a function of the received differential signal Vd. For instance, the receiver circuit 104 may be configured to set signal $PWM_{RX}$ to a high logic value (logic '1') as a result of a positive pulse being detected in the differential signal Vd, and to a low logic value (logic '0') as a result of a negative pulse being detected in the differential signal Vd, as exemplified in FIG. 2. Therefore, the reconstructed signal $PWM_{RX}$ may substantially correspond to a (slightly) delayed copy of the input signal $PWM_{IN}$. The high-voltage die 10b may further include a driver stage 105 including a pre-driver circuit (e.g., buffers 1051, 1052, 1053) configured to receive the reconstructed signal $PWM_{RX}$ and drive an output switching circuit as a function thereof (e.g., inverting at inverter 1051 and/or amplifying at buffers 1052, 1053 the reconstructed signal $PWM_{RX}$). For instance, the output switching circuit may include a half-bridge driving stage that includes a high-side switch (e.g., transistor) and a low-side switch (e.g., transistor) arranged in series between a high-voltage supply pin VH and a high-voltage reference (or ground) pin VL of the gate driver device 10. A node intermediate the high-side switch and the low-side switch may be electrically coupled to the output pin 106 of the gate driver device 10. The high-side switch and the low-side switch are driven by the pre-driver circuit 1051, 1052, 1053 so that the output switching signal $PWM_{OUT}$ is produced at the output pin 106 (e.g., the high-side switch is in a conductive state when $PWM_{RX}$='1' and the low-side switch is in a conductive state when $PWM_{RX}$='0').

In the present disclosure, reference is made to the case where the isolation capacitors 103P, 103N are implemented in the low-voltage die 10a. However, it will be understood that the isolation capacitors could alternatively be implemented in the high-voltage die 10b, e.g., arranged between the input pins of the high-voltage die 10b and the input terminals of the receiver circuit 104.

FIG. 3 is a circuit block diagram exemplary of a possible implementation of receiver circuit 104, and FIG. 4 is a time diagram including waveforms exemplary of signals in the receiver circuit 104 of FIG. 3, which illustrates possible operation of the receiver circuit. The input terminals of circuit 104, which may be referenced to a local (high-voltage) ground $GND_{HV}$ via respective resistors, receive the differential signal Vd and are coupled to an amplifier stage 40 that produces an amplified replica of the differential signal Vd. The amplified differential signal is received at a pair of comparators 42, 44 having opposite input polarities (e.g., the positive output of amplifier 40 may be coupled to the negative input of comparator 42 and to the positive input of comparator 44, and the negative output of amplifier 40 may be coupled to the positive input of comparator 42 and to the negative input of comparator 44). Therefore, comparator 42 produces a (digital) signal $COMP_N$ that includes pulses corresponding to the positive spikes of signal Vd (e.g., signal $COMP_N$ is normally high and includes low pulses, as exemplified in FIG. 4) and comparator 44 produces a (digital) signal $COMP_P$ that includes pulses corresponding to the negative spikes of signal Vd (e.g., signal $COMP_P$ is normally high and includes low pulses, as exemplified in FIG. 4). Signals $COMP_N$ and $COMP_P$ are used as the set and reset signals of a set-reset (S-R) flip-flop 46 of receiver 104. In particular, flip-flop 46 receives a bias voltage $V_{DD}$ (e.g., 3.3 V) at its data input terminal D, signal $COMP_N$ (possibly complemented by an inverter stage) at its clock input terminal $C_P$, and signal $COMP_P$ at its reset input terminal CD. The data output terminal Q of flip-flop 46 is therefore set to a high logic value (logic '1') in response to a pulse of signal $COMP_N$ (in particular, in response to a falling edge of signal $COMP_N$) and to a low logic level (logic '0') in response to a pulse of signal $COMP_P$ (in particular, in response to a falling edge of signal $COMP_P$), thereby producing the reconstructed PWM signal $PWM_{RX}$ that corresponds to a (delayed) copy of the input PWM signal $PWM_{IN}$ sent by the low-voltage die 10a of device 10 (as exemplified in FIG. 4). The time interval between two consecutive spikes of signal Vd (and thus between two consecutive pulses of signal $COMP_N$ or $COMP_P$) is equal to half of the clock period $T_{CLK}$ of the low-voltage clock signal CLK (e.g., $T_{CLK}/2$).

As anticipated, a driver device 10 may be used for motor control applications, as exemplified in the circuit block diagram of FIG. 5, which shows the driver portion of device 10 having its output pin 106 (e.g., the central node or switching node of the half-bridge driver that includes a high-side switch HS and a low-side switch LS) coupled to an external load such as a motor M. As exemplified in FIG. 5, the low-side driver circuit 1053 may be supplied between the supply voltage of die 10b available at pin VH and the local ground voltage $GND_{HV}$ (the latter being available at pin VL), while the high-side driver circuit 1052 may be supplied between the supply voltage of die 10b available at pin VH and the switching node 106 (i.e., it may be referenced to a floating ground $GND_S$). In such a scenario, during the switching activity of the half-bridge circuit, the switching node 106 that provides the high-side floating ground $GND_S$ switches continuously between the local ground voltage $GND_{HV}$ (e.g., 0 V) and the supply voltage of die 10b available at pin VH, which can be in the order of thousand volts. Therefore, the driver device 1052 may be subjected to fast slew-rate voltage transitions between GND and $GND_S$ of dies 10a and 10b. These events may generate an abrupt current flow that produces a common-mode voltage at the input terminals of the receiver circuit 104. The input terminals of receiver 104 may be affected by mismatch (e.g., due to parasitic capacitors towards the low-voltage ground associated to the bonding wires), so the common-mode voltage may be converted in a spurious differential voltage that adds to signal Vd.

The scenario above is exemplified in the circuit block diagram of FIG. 6, which substantially replicates the circuit block diagram of FIG. 3 but additionally indicates a common-mode voltage $V_{CM}$ applied to the input terminals of amplifier 40. FIG. 7 is a time diagram including waveforms exemplary of signals in the receiver circuit of FIG. 6, when such a common-mode voltage $V_{CM}$ affects the differential signal Vd. It will be understood that the voltage generator depicted in FIG. 6 is not a component actually implemented in the circuit, but just indicates the effect of applying a common-mode voltage to the input terminals of receiver 104. In particular, the waveform of the common-mode voltage $V_{CM}$ produced between the low-voltage ground $GND_{LV}$ and the high-voltage ground $GND_{HV}$ during transient events may include a high slew-rate ramp followed by a ringing phase (e.g., a damped sinusoidal) due to the effect of (external) parasitic components. As results, due to the mismatch of the input terminals of amplifier 40, the receiver 104 senses a differential damped sinusoidal high-frequency signal, whose frequency may fall within the amplification band of the receiver chain (e.g., the band of amplifier 40). This damped sinusoidal signal may thus be amplified and produce a sequence of spurious set and reset pulses (e.g., spurious pulses SP of signals $COMP_N$ and $COMP_P$, as exemplified in FIG. 7) that are subsequently sensed by flip-flop 46 and produce unwanted commutations of the reconstructed signal $PWM_{RX}$ (e.g., commutations UC of signal $PWM_{RX}$, as exemplified in FIG. 7).

In order to mitigate the above-discussed issue of spurious pulses in the reconstructed signal $PWM_{RX}$ due to common-mode ringing effects in the differentia signal Vd, a possible approach is that of implementing the isolation capacitors 103P, 103N in the high-voltage die 10b. This implementation cancels the effect of the mismatch of the bonding wires between die 10a and die 10b, which would be dominated by the transmitter low equivalent impedance. However, such an approach requires that the isolation capacitors 103P, 103N be realized in the same technology of the high-voltage die 10b, which may be cumbersome, costly and/or area-consuming.

Therefore, there is a need in the art to provide a receiver circuit (e.g., for implementation in an isolated communication channel of a gate driver device) having an improved architecture that solves the issue discussed above or, in other terms, a receiver circuit having an improved common-mode transient immunity (CMTI).

BRIEF SUMMARY

An object of one or more embodiments is to contribute in providing such an improved receiver circuit.

According to one or more embodiments, such an object can be achieved by a circuit having the features set forth in the claims that follow.

One or more embodiments may relate to a corresponding isolated driver device.

One or more embodiments may relate to a corresponding electronic system.

One or more embodiments may relate to a corresponding method of decoding a differential pulsed signal transmitted across a galvanic isolation barrier to produce a pulse-width modulated digital signal.

The claims are an integral part of the technical teaching provided herein in respect of the embodiments.

According to an aspect of the present description, in a receiver circuit a pair of input nodes are configured to receive a differential signal therebetween. The differential signal includes spikes of a first polarity (e.g., positive) and spikes of a second polarity (e.g., negative). A first comparator circuit is configured to receive the differential signal and to produce an intermediate set signal that includes a pulse at each spike of the differential signal having the first polarity. A second comparator circuit is configured to receive the differential signal and to produce an intermediate reset signal that includes a pulse at each spike of the differential signal having the second polarity. A sensing circuit is coupled to the pair of input nodes and is configured to extract a common-mode voltage signal from the differential signal, and to assert at least one control signal in response to the amplitude of the common-mode voltage signal exceeding a threshold value. A logic circuit is configured to receive the intermediate set signal, the intermediate reset signal and the at least one control signal. The logic circuit is further configured to:

assert a masking signal for a masking time interval in response to the at least one control signal being asserted, and de-assert the masking signal in response to the masking time interval elapsing;

produce a corrected set signal by passing the intermediate set signal when the masking signal is de-asserted and masking the intermediate set signal when the masking signal is de-asserted, whereby the corrected set signal includes only the pulses of the intermediate set signal produced while the masking signal is de-asserted; and produce a corrected reset signal by passing the intermediate reset signal when the masking signal is de-asserted and masking the intermediate reset signal when the masking signal is de-asserted, whereby the corrected reset signal includes only the pulses of the intermediate reset signal produced while the masking signal is de-asserted.

The receiver circuit includes an output control circuit configured to receive the corrected set signal and the corrected reset signal, and further configured to assert a digital output signal in response to a pulse being detected in the corrected set signal and de-assert the digital output signal in response to a pulse being detected in the corrected reset signal.

One or more embodiments may thus provide a receiver circuit having an improved robustness against common-mode noises that uses (only) simple logic circuitry.

According to another aspect of the present description, an isolated driver device includes a first semiconductor die and a second semiconductor die. The first semiconductor die includes an input pin configured to receive a digital input signal. The first semiconductor die includes a transmitter circuit configured to receive the digital input signal and to produce a pair of complementary digital signals. A first one of the complementary digital signals is a replica of the digital input signal and is produced at a first output node of the transmitter circuit, and a second one of the complementary digital signals is the complement of the digital input signal and is produced at a second output node of the transmitter circuit. The first semiconductor die includes a galvanic isolation barrier including a first isolation capacitor having a first terminal coupled to the first output node of the transmitter circuit and a second isolation capacitor having a first terminal coupled to the second output node of the transmitter circuit. A differential signal is produced between a second terminal of the first isolation capacitor and a second terminal of the second isolation capacitor. The differential signal includes a spike of a first polarity at each rising edge of the digital input signal and a spike of a second polarity at each falling edge of the digital transmission signal. The second semiconductor die includes a receiver circuit according to one or more embodiments. A first input node of the receiver circuit is electrically coupled to the second terminal of the first isolation capacitor and a second input node of the receiver circuit is electrically coupled to the second terminal of the second isolation capacitor to receive the differential signal.

According to another aspect of the present description, an electronic system includes a processing unit (e.g., processor) and an isolated driver device according to one or more embodiments. The processing unit is configured to generate the digital input signal received by the isolated driver device.

According to another aspect of the present description, a method of decoding a differential signal into a digital output signal includes:

receiving a differential signal that includes spikes of a first polarity (e.g., positive) and spikes of a second polarity (e.g., negative);

producing an intermediate set signal that includes a pulse at each spike of the differential signal having the first polarity;

producing an intermediate reset signal that includes a pulse at each spike of the differential signal having the second polarity;

extracting a common-mode voltage signal from the differential signal;

asserting at least one control signal in response to the amplitude of the common-mode voltage signal exceeding a threshold value;

asserting a masking signal for a masking time interval in response to the at least one control signal being asserted, and de-asserting the masking signal in response to the masking time interval elapsing;

producing a corrected set signal by passing the intermediate set signal when the masking signal is de-asserted and masking the intermediate set signal when the masking signal is de-asserted;

producing a corrected reset signal by passing the intermediate reset signal when the masking signal is de-asserted and masking the intermediate reset signal when the masking signal is de-asserted; and asserting a digital output signal in response to a pulse being detected in the corrected set signal and de-asserting the digital output signal in response to a pulse being detected in the corrected reset signal.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

Figure 1:
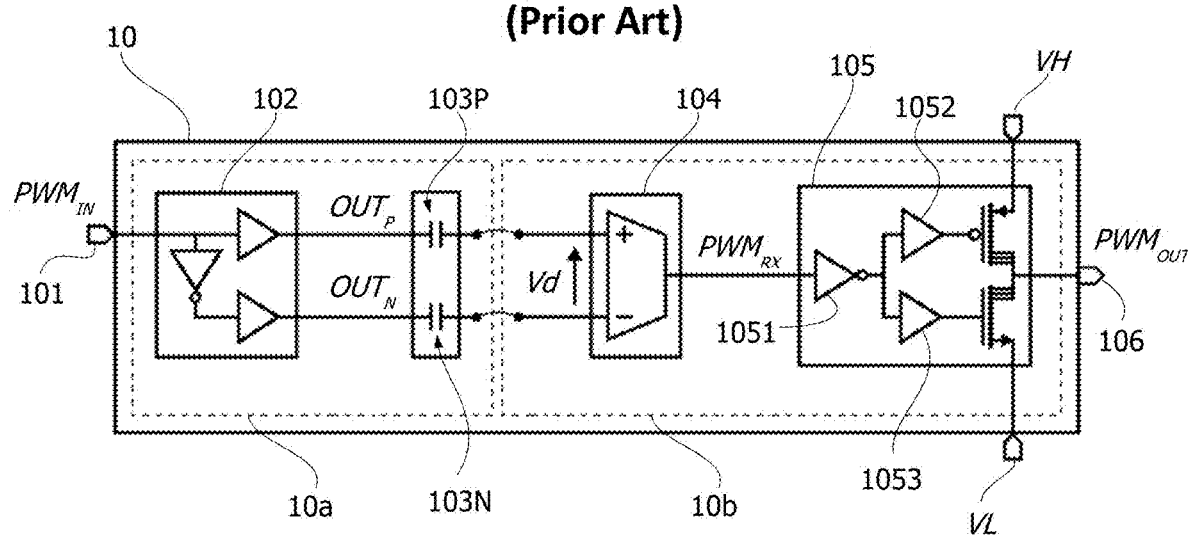
FIG. 1 is a circuit block diagram exemplary of an isolated gate driver device.
Figure 2:
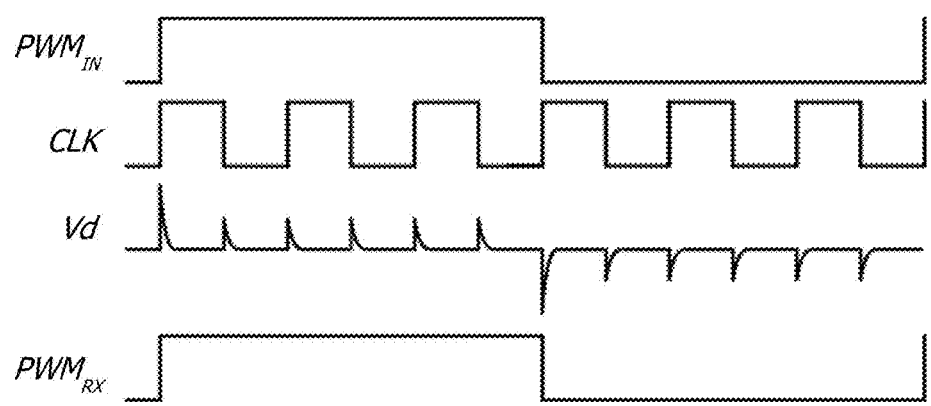
FIG. 2 is a time diagram including waveforms exemplary of signals in the device of FIG. 1.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

One or more embodiments relate to a receiver circuit that is configured to reject the spurious pulses SP produced in the set and reset signals $COMP_N$ and $COMP_P$ due to unwanted oscillations of the differential signal Vd (e.g., ringing effects caused by common-mode voltage transients applied at the input of the receiver circuit) to improve the common-mode transient immunity (CMTI). In particular, one or more embodiments rely on an improved receiver architecture that includes a sensing circuit and a logic circuit arranged in parallel to the signal amplification chain. The sensing circuit is configured to sense the common-mode voltage at the input terminals of the amplifying stage 40, and the logic circuit is configured to mask the set and reset signals in case the sensed common-mode voltage exceeds a threshold, so as to produce corrected set and reset signals that are free from the spurious pulses and are used to control the output flip-flop 46.

One or more embodiments may thus relate to a receiver circuit 104' as exemplified in the circuit block diagram of FIG. 8, where parts or elements similar to those described with reference to the previous Figures are indicated by the same or similar reference numbers, and a corresponding description is not repeated for brevity. FIG. 9 is a time diagram including waveforms exemplary of signals in the receiver circuit 104', which illustrates possible operation of the receiver circuit. It is noted that possible modifications of the circuit which (only) impact on the polarity of digital signals are intended to be covered by the instant disclosure, insofar as digital signals may be conveniently selected to be asserted-high or asserted-low depending on the needs of the application.

In particular, the receiver circuit 104' includes a common-mode voltage sensing circuit 80 coupled to the input terminals of the receiver circuit 104', and a logic circuit 81 coupled to the output of the sensing circuit 80 and arranged between the output terminals of the comparators 42, 44 and the input terminals of the set-reset flip-flop 46. The logic circuit 81 receives the "original" set and reset signals $COMP_N$, $COMP_P$, which are possibly affected by spurious pulses, as well as two control signals VC1, VC2 produced by the sensing circuit 80. The logic circuit 81 is configured to produce the "corrected" set and reset signals $COMP'_N$, $COMP'_P$, which are propagated to the flip-flop 46 (with signal $COMP'_N$ possibly complemented, just like previously described with reference to FIG. 3) and result in a reconstructed PWM signal $PWM_{RX}$ that is free from spurious pulses.

Figure 8:
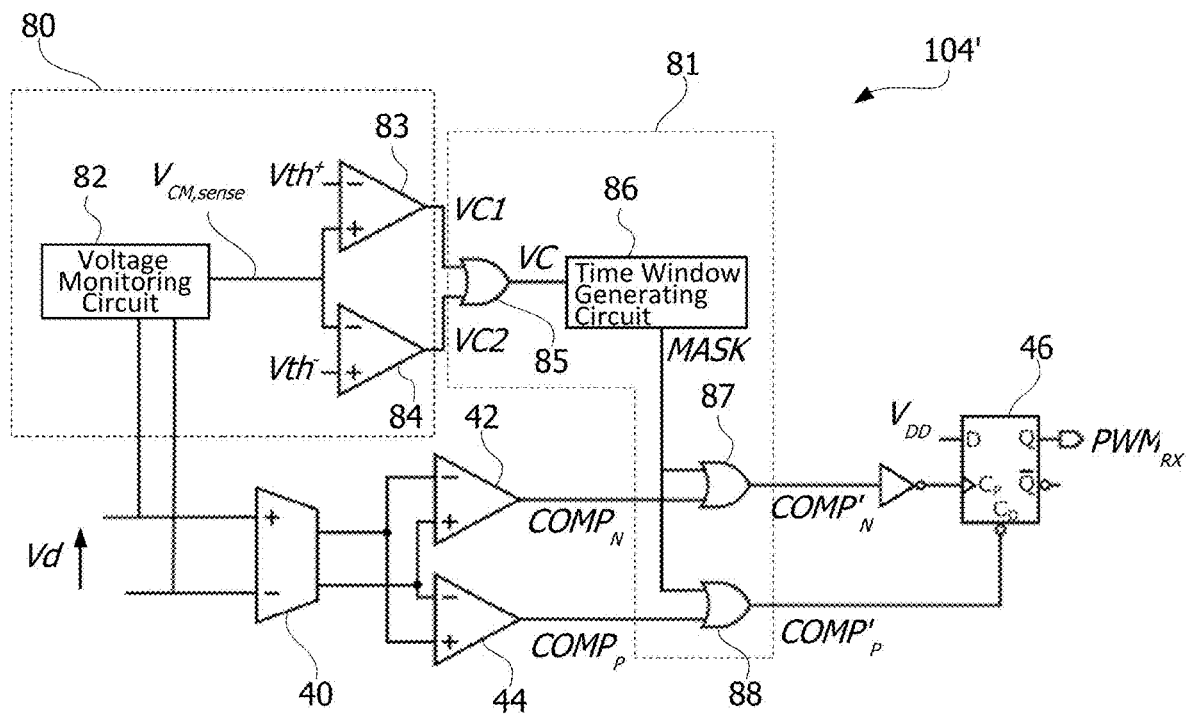
FIG. 8 is a circuit block diagram exemplary of a receiver circuit according to one or more embodiments of the present description, e.g., for use in an isolated communication channel of a driver device.
Figure 9:
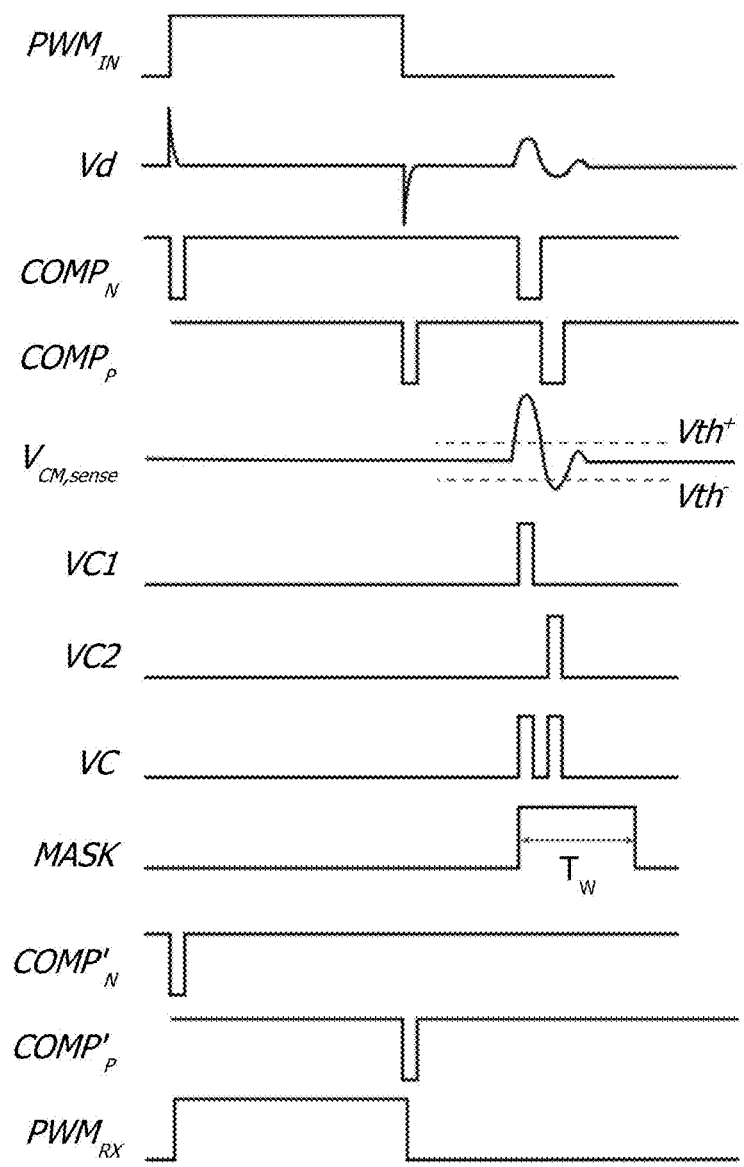
FIG. 9 is a time diagram including waveforms exemplary of signals in the receiver circuit of FIG. 8, according to one or more embodiments of the present description.

As exemplified in FIG. 8, the sensing circuit 80 is configured to sense (e.g., extract) the common-mode voltage at the input terminals of amplifier 40 to produce a sensing voltage signal $V_{CM,sense}$, and produce a first control signal VC1 that is asserted when signal $V_{CM,sense}$ is higher than a positive threshold $Vth^+$ as well as a second control signal VC2 that is asserted when signal $V_{CM,sense}$ is lower than a negative threshold Vth (with the two thresholds possibly being symmetrical with respect to the ground reference voltage, i.e., $Vth^-=-Vth^+$). Therefore, signal VC1 is substantially indicative of a positive spurious spike in the differential voltage Vd, and thus indicative of a spurious pulse in the "original" set signal $COMP_N$, while signal VC2 is substantially indicative of a negative spurious spike in the differential voltage Vd, and thus indicative of a spurious pulse in the "original" reset signal $COMP_P$, as exemplified in FIG. 9.

In particular, the sensing circuit 80 includes a voltage monitoring circuit 82 coupled to the input terminals of the amplifier 40 and configured to produce the sensing voltage signal $V_{CM,sense}$, e.g., by producing the arithmetic average of the differential signal Vd. The sensing circuit 80 further includes a first comparator 83 having a first (e.g., non-inverting) input terminal coupled to circuit 82 to receive signal $V_{CM,sense}$ and a second (e.g., inverting) input terminal configured to receive the positive threshold $Vth^+$, thus asserting (e.g., high) signal VC1 when $V_{CM,sense}>Vth^+$ and de-asserting (e.g., low) signal VC1 when $V_{CM,sense}<Vth^+$. The sensing circuit 80 further includes a second comparator 84 having a first (e.g., inverting) input terminal coupled to circuit 82 to receive signal $V_{CM,sense}$ and a second (e.g., non-inverting) input terminal configured to receive the negative threshold Vth, thus asserting (e.g., high) signal VC2 when $V_{CM,sense}<Vth$ and de-asserting (e.g., low) signal VC2 when $V_{CM,sense}>Vth^-$.

In particular, the logic circuit 81 includes a logic gate 85 configured to combine the control signals VC1 and VC2 to produce a global control signal VC that is asserted (e.g., high) when any of signals VC1 and VC2 is asserted, i.e., it is indicative of both positive and negative common voltages being detected. For instance, logic gate 85 may include an OR logic gate configured to apply OR logic processing to signals VC1 and VC2 to produce signal VC. The logic circuit 81 further includes a time window generating circuit 86 configured to receive the control signal VC and to produce a masking signal MASK. In particular, circuit 86 may assert (e.g., high) the masking signal MASK for a certain time interval (or window) $T_W$ in response to a pulse in the control signal VC, and de-assert (e.g., low) signal MASK when the time interval $T_W$ elapses, as exemplified in FIG. 9. By selecting the duration $T_W$ of the masking window to be higher than the duration of the spurious spikes of signal Vd (e.g., $T_W$ being in the range of approximately 10 ns to 30 ns), the masking signal MASK may be asserted as long as a masking action is needed. The logic circuit 81 further includes a first logic gate 87 configured to combine the original set signal $COMP_N$ and the masking signal MASK to produce the corrected set signal $COMP'_N$, in such a way that the pulses of signal $COMP_N$ are propagated to signal $COMP'_N$ when the masking signal is de-asserted, and are not propagated to signal $COMP'_N$ (e.g., signal $COMP'_N$ remains at a high logic level) when the masking signal is asserted. For instance, logic gate 87 may include an OR logic gate configured to apply OR logic processing to signals $COMP_N$ and MASK to produce signal $COMP'_N$. Similarly, the logic circuit 81 further includes a second logic gate 88 configured to combine the original reset signal $COMP_P$ and the masking signal MASK to produce the corrected reset signal $COMP'_P$, in such a way that the pulses of signal $COMP_P$ are propagated to signal $COMP'_P$ when the masking signal is de-asserted, and are not propagated to signal $COMP'_P$ (e.g., signal $COMP'_P$ remains at a high logic level) when the masking signal is asserted. For instance, logic gate 88 may include an OR logic gate configured to apply OR logic processing to signals $COMP_P$ and MASK to produce signal $COMP'_P$.

Figure 3:
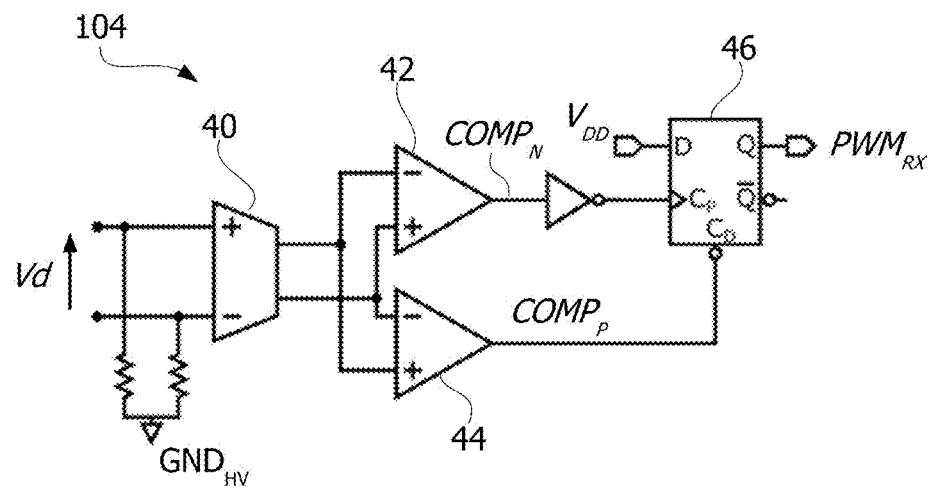
FIG. 3 is a circuit block diagram exemplary of receiver circuit 104.
Figure 4:
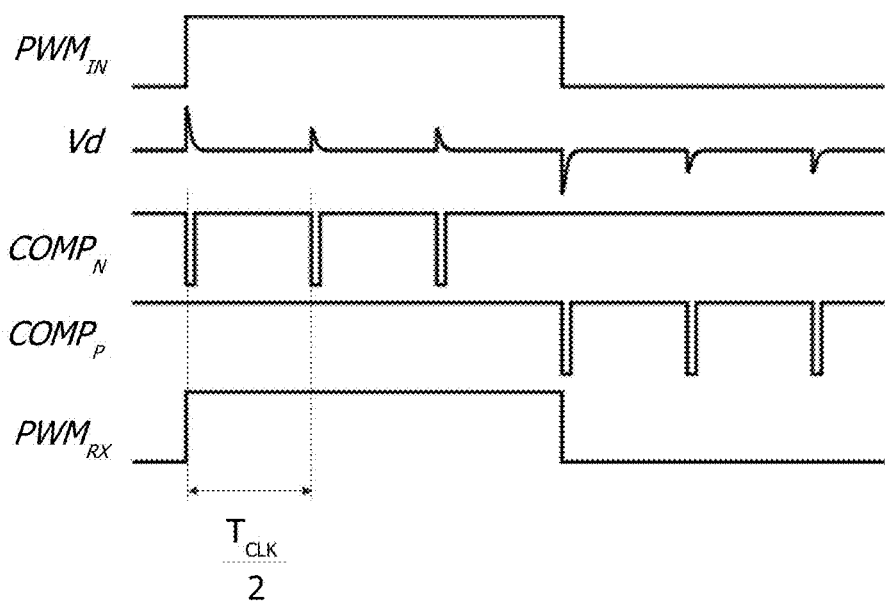
FIG. 4 is a time diagram including waveforms exemplary of signals in the receiver circuit 104 of FIG. 3.
Figure 5:
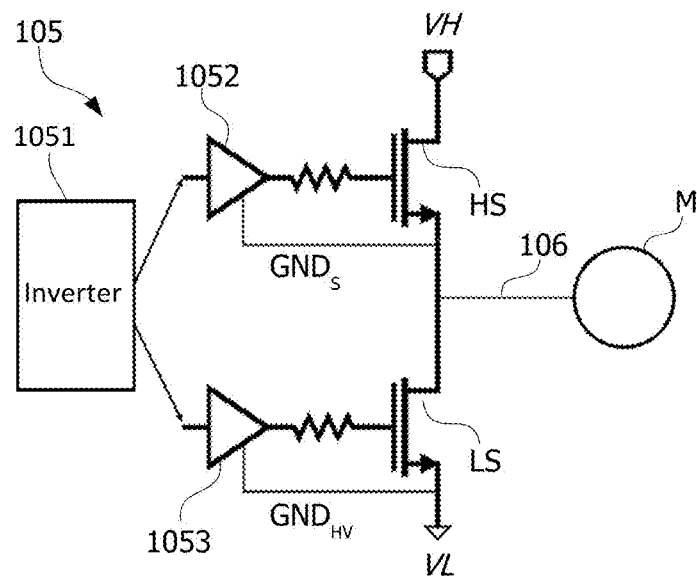
FIG. 5 shows the driver portion of device 10.
Figure 6:
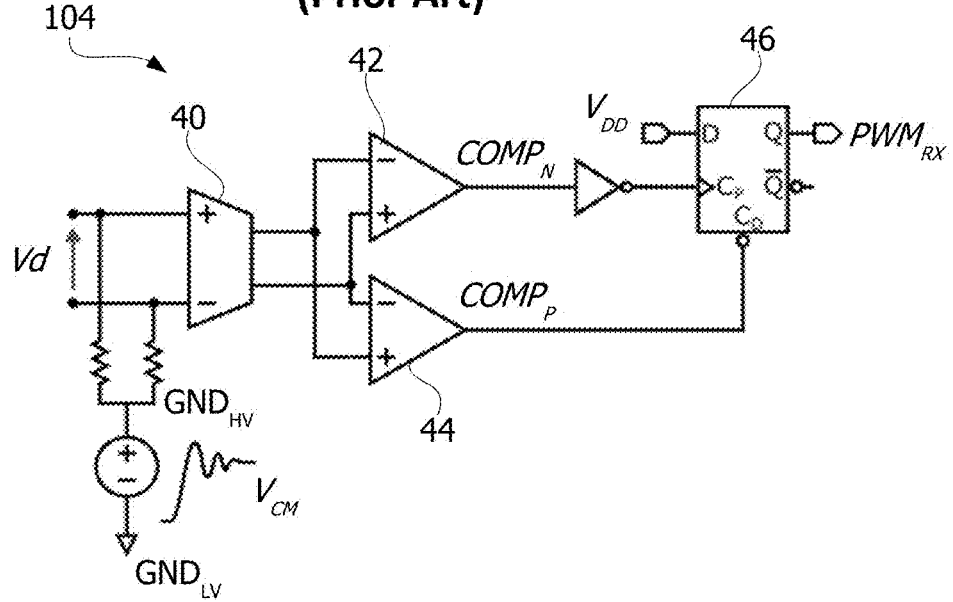
FIG. 6 is a circuit block diagram exemplary of a receiver circuit in which a common-mode voltage is applied to input terminals of an amplifier.
Figure 7:
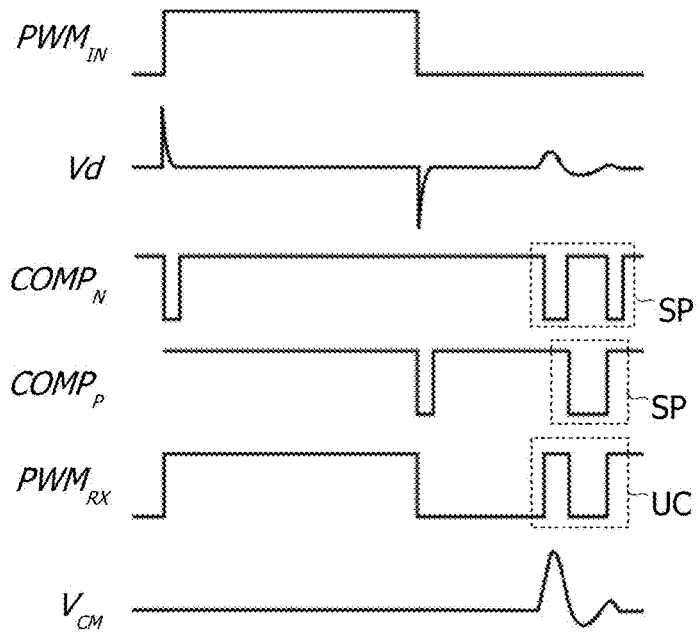
FIG. 7 is a time diagram including waveforms exemplary of signals in the receiver circuit of FIG. 6.

As exemplified in FIG. 8, the corrected signals $COMP'_N$ and $COMP'_P$ are then used as the set and reset signals of the set-reset (S-R) flip-flop 46 of receiver 104', as described with reference to FIG. 3. Thus, flip-flop 46 receives signal $COMP'_N$ (possibly complemented by an inverter stage) at its clock input terminal $C_P$ and signal $COMP'_P$ at its reset input terminal CD to produce the reconstructed PWM signal $PWM_{RX}$.

In one or more embodiments, the value of the positive and negative thresholds ($Vth^+$ and $Vth^-$) may be selected considering a trade-off between the following factors: the worst case scenario for the possible mismatch of the impedance of the input terminals of amplifier 40; the overall capacitance of the parasitic capacitor seen from the input terminals of the receiver towards the low-voltage die 10a; the worst case scenario for the common-mode transient value (dV/dT, expressed in V/ns); and the minimum signal amplitude that can be functionally processed by the receiver circuit.

One or more embodiments may prove functional provided that:
the application where the receiver circuit is implemented does not require the transmission of a functional PWM signal synchronously with an unexpected (random) external common-mode noise;
the masking path 80, 81 acts faster than the signal path 40, 42, 44 in order to prevent propagation of spurious events to the flip-flop 46; and
the duration $T_W$ of the masking window is sufficiently shorter than period of the PWM signal $PWM_{IN}$.

One or more embodiments may thus prove advantageous insofar as they provide a receiver circuit having an advanced grade of robustness against common-mode noises by using (only) logic circuitry added in the decoding circuit to correct spurious signals generated by ringing. Thus, one or more embodiments rely on a simple implementation (e.g., just including additional logic gates compared to the conventional solutions), which is compatible with the conventional transmitter/receiver architectures.

Additionally, the solution disclosed herein, based on masking circuitry, proves to be functional also in case the common-mode slew rate at the input terminals of the amplifier stage 40 is so high that the amplifier stage 40 is brought to saturation, which would result in an undefined output state of the amplifier 40. This feature is particularly useful even in cases where the parasitic mismatch of the input terminals is small (even negligible) and does not represent a significant source of failure for the receiver circuit 104'.

Without prejudice to the underlying principles, the details and embodiments may vary, even significantly, with respect to what has been described by way of example only, without departing from the extent of protection.

The extent of protection is determined by the annexed claims.

A receiver circuit (104'), may be summarized as including: a pair of input nodes configured to receive a differential signal (Vd) therebetween, the differential signal (Vd) including spikes of a first polarity and spikes of a second polarity; a first comparator circuit (42) configured to receive said differential signal (Vd) and to produce an intermediate set signal ($COMP_N$) that includes a pulse at each spike of said differential signal (Vd) having said first polarity; a second comparator circuit (44) configured to receive said differential signal (Vd) and to produce an intermediate reset signal ($COMP_P$) that includes a pulse at each spike of said differential signal (Vd) having said second polarity; a sensing circuit (80) coupled to said pair of input nodes and configured to extract a common-mode voltage signal ($V_{CM,sense}$) from said differential signal (Vd) and to assert at least one control signal (VC1, VC2) in response to the amplitude of said common-mode voltage signal ($V_{CM,sense}$) exceeding a threshold value ($Vth^+$, $Vth^-$); a logic circuit (81) configured to receive said intermediate set signal ($COMP_N$), said intermediate reset signal ($COMP_P$) and said at least one control signal (VC1, VC2), and further configured to: assert a masking signal (MASK) for a masking time interval ($T_W$) in response to said at least one control signal (VC1, VC2) being asserted, and de-assert said masking signal (MASK) in response to said masking time interval ($T_W$) elapsing; produce (87) a corrected set signal ($COMP'_N$) by passing the intermediate set signal ($COMP_N$) when said masking signal (MASK) is de-asserted and masking the intermediate set signal ($COMP_N$) when said masking signal (MASK) is de-asserted, whereby said corrected set signal ($COMP'_N$) includes only the pulses of said intermediate set signal ($COMP_N$) produced while the masking signal (MASK) is de-asserted; and produce (88) a corrected reset signal ($COMP'_P$) by passing the intermediate reset signal ($COMP_P$) when said masking signal (MASK) is de-asserted and masking the intermediate reset signal ($COMP_P$) when said masking signal (MASK) is de-asserted, whereby said corrected reset signal ($COMP'_P$) includes only the pulses of said intermediate reset signal ($COMP_N$) produced while the masking signal (MASK) is de-asserted; and an output control circuit (46) configured to receive said corrected set signal ($COMP'_N$) and said corrected reset signal ($COMP'_P$), and further configured to assert a digital output signal ($PWM_{RX}$) in response to a pulse being detected in said corrected set signal ($COMP'_N$) and de-assert said digital output signal ($PWM_{RX}$) in response to a pulse being detected in said corrected reset signal ($COMP'_P$).

Said sensing circuit (80) may be configured to assert a first control signal (VC1) in response to said common-mode voltage signal ($V_{CM,sense}$) being higher than a positive threshold ($Vth^+$) and assert a second control signal (VC2) in response to said common-mode voltage signal ($V_{CM,sense}$)

being lower than a negative threshold (Vth); said logic circuit (81) may be configured to receive said first control signal (VC1) and said second control signal (VC2), assert a global control signal (VC) in response to any of said first (VC1) and second (VC2) control signals being asserted, and assert said masking signal (MASK) for a masking time interval ($T_W$) in response to said global control signal (VC) being asserted.

Said sensing circuit (80) may include: a voltage monitoring circuit (82) configured to produce said common-mode voltage signal ($V_{CM,sense}$) by producing an arithmetic average of said differential signal (Vd); a first comparator circuit (83) configured to compare said common-mode voltage signal ($V_{CM,sense}$) to said positive threshold (Vth$^+$) to assert and de-assert said first control signal (VC1); and a second comparator circuit (84) configured to compare said common-mode voltage signal ($V_{CM,sense}$) to said negative threshold (Vth$^-$) to assert and de-assert said second control signal (VC2).

Said logic circuit (81) may include: a first logic gate (85) configured to receive said first control signal (VC1) and said second control signal (VC2), and assert said global control signal (VC) in response to any of said first (VC1) and second (VC2) control signals being asserted; a time window generating circuit (86) configured to assert said masking signal (MASK) for a masking time interval ($T_W$) in response to said global control signal (VC) being asserted, and de-assert said masking signal (MASK) in response to said masking time interval ($T_W$) elapsing; a second logic gate (87) configured to pass the intermediate set signal (COMP$_N$) when said masking signal (MASK) is de-asserted and masking the intermediate set signal (COMP$_N$) when said masking signal (MASK) is de-asserted; and a third logic gate (88) configured to pass the intermediate reset signal (COMP$_P$) when said masking signal (MASK) is de-asserted and masking the intermediate reset signal (COMP$_P$) when said masking signal (MASK) is de-asserted.

Said first logic gate (85) may include an OR logic gate configured to apply OR logic processing to said first control signal (VC1) and said second control signal (VC2) to produce said global control signal (VC); said second logic gate (87) may include an OR logic gate configured to apply OR logic processing to said intermediate set signal (COMP$_N$) and said masking signal (MASK) to produce said corrected set signal (COMP'$_N$); and said third logic gate (88) may include an OR logic gate configured to apply OR logic processing to said intermediate reset signal (COMP$_P$) and said masking signal (MASK) to produce said corrected reset signal (COMP'$_P$).

Said output control circuit may include a set-reset flip-flop (46), the set-reset flip-flop (46) having a clock input terminal ($C_P$) driven by said corrected set signal (COMP'$_N$) and a reset input terminal (CD) driven by said corrected reset signal (COMP'$_P$) to produce said digital output signal (PWM$_{RX}$) at a data output terminal (Q) of the set-reset flip-flop (46).

The receiver circuit (104') may include an amplifier circuit (40) configured to receive said differential signal (Vd) and pass an amplified replica of said differential signal (Vd) to said first comparator circuit (42) and to said second comparator circuit (44).

The receiver circuit (104') may include a driver circuit that includes a half-bridge circuit, the half-bridge circuit being arranged between a positive supply voltage pin (VH) and a reference supply voltage pin (VL) and driven by said digital output signal (PWM$_{RX}$) to produce an output switching signal (PWM OUT).

An isolated driver device (10), may be summarized as including a first semiconductor die (10a) and a second semiconductor die (10b), wherein the first semiconductor die (10a) includes: an input pin (101) configured to receive a digital input signal (PWM$_{IN}$); a transmitter circuit (102) configured to receive said digital input signal (PWM$_{IN}$) and to produce a pair of complementary digital signals (OUT$_P$, OUT$_N$), wherein a first one (OUT$_P$) of said complementary digital signals is a replica of said digital input signal (PWM$_{IN}$) and is produced at a first output node of said transmitter circuit (102), and a second one (OUT$_N$) of said complementary digital signals is the complement of said digital input signal (PWM$_{IN}$) and is produced at a second output node of said transmitter circuit (102); and a galvanic isolation barrier including a first isolation capacitor (103P) having a first terminal coupled to the first output node of said transmitter circuit (102) and a second isolation capacitor (103N) having a first terminal coupled to the second output node of said transmitter circuit (102), whereby a differential signal (Vd) is produced between a second terminal of said first isolation capacitor (103P) and a second terminal of said second isolation capacitor (103N), the differential signal (Vd) including a spike of a first polarity at each rising edge of said digital input signal (PWM$_{IN}$) and a spike of a second polarity at each falling edge of said digital transmission signal (PWM$_{IN}$), wherein the second semiconductor die (10b) includes a receiver circuit (104') according to any of the previous claims; and wherein a first input node of the receiver circuit (104') is electrically coupled to the second terminal of said first isolation capacitor (103P) and a second input node of the receiver circuit (104') is electrically coupled to the second terminal of said second isolation capacitor (103P) to receive said differential signal (Vd).

An electronic system, may be summarized as including a processing unit and an isolated driver device (10) according to claim 9, the processing unit being configured to generate said digital input signal (PWM$_{IN}$) received by the isolated driver device (10).

A method of decoding a differential signal (Vd) into a digital output signal (PWM$_{RX}$), the method may be summarized as including: receiving a differential signal (Vd) that includes spikes of a first polarity and spikes of a second polarity; producing an intermediate set signal (COMP$_N$) that includes a pulse at each spike of said differential signal (Vd) having said first polarity; producing an intermediate reset signal (COMP$_P$) that includes a pulse at each spike of said differential signal (Vd) having said second polarity; extracting a common-mode voltage signal ($V_{CM,sense}$) from said differential signal (Vd); asserting at least one control signal (VC1, VC2) in response to the amplitude of said common-mode voltage signal ($V_{CM,sense}$) exceeding a threshold value (Vth$^+$, Vth); asserting a masking signal (MASK) for a masking time interval ($T_W$) in response to said at least one control signal (VC1, VC2) being asserted, and de-asserting said masking signal (MASK) in response to said masking time interval ($T_W$) elapsing; producing (87) a corrected set signal (COMP'$_N$) by passing the intermediate set signal (COMP$_N$) when said masking signal (MASK) is de-asserted and masking the intermediate set signal (COMP$_N$) when said masking signal (MASK) is de-asserted; producing (88) a corrected reset signal (COMP'$_P$) by passing the intermediate reset signal (COMP$_P$) when said masking signal (MASK) is de-asserted and masking the intermediate reset signal (COMP$_P$) when said masking signal (MASK) is de-asserted; and asserting a digital output signal (PWM$_{RX}$) in response to a pulse being detected in said corrected set signal (COMP'$_N$)

and de-asserting said digital output signal ($PWM_{RX}$) in response to a pulse being detected in said corrected reset signal ($COMP'_P$).

Figure 10:
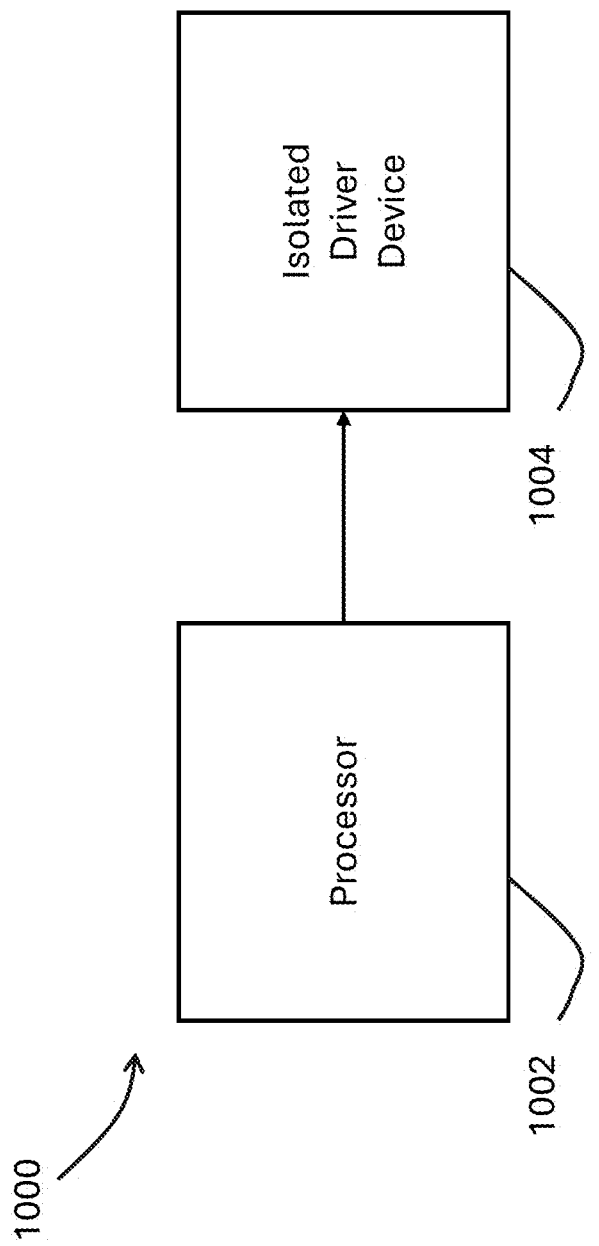
FIG. 10 shows an electronic system.

FIG. 10 shows an electronic system 1000. The electronic system 1000 includes a processor 1002 and an isolated driver device 1004. The processor 1002 generates a digital input signal. The digital input signal is received by the isolated driver device 1004.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A receiver circuit, comprising:
a pair of input nodes configured to receive a differential signal therebetween, the differential signal including spikes of a first polarity and spikes of a second polarity;
a first receiver circuit comparator circuit configured to receive the differential signal and output an intermediate set signal that includes a pulse at each spike of the differential signal having the first polarity;
a second receiver circuit comparator circuit configured to receive the differential signal and output an intermediate reset signal that includes a pulse at each spike of the differential signal having the second polarity;
a sensing circuit coupled to the pair of input nodes and configured to extract a common-mode voltage signal from the differential signal and to assert at least one control signal in response to an amplitude of the common-mode voltage signal exceeding a threshold value;
a logic circuit configured to:
receive the intermediate set signal, the intermediate reset signal and the at least one control signal;
assert a masking signal for a masking time interval in response to the at least one control signal being asserted, and de-assert the masking signal in response to the masking time interval elapsing;
produce a corrected set signal by passing the intermediate set signal when the masking signal is de-asserted and masking the intermediate set signal when the masking signal is de-asserted, wherein the corrected set signal includes the pulses of the intermediate set signal produced while the masking signal is de-asserted; and
produce a corrected reset signal by passing the intermediate reset signal when the masking signal is de-asserted and masking the intermediate reset signal when the masking signal is de-asserted, wherein the corrected reset signal includes the pulses of the intermediate reset signal produced while the masking signal is de-asserted; and
an output control circuit configured to:
receive the corrected set signal and the corrected reset signal; and
assert a digital output signal in response to a pulse being detected in the corrected set signal and de-assert the digital output signal in response to a pulse being detected in the corrected reset signal.

2. The receiver circuit of claim 1, wherein:
the sensing circuit is configured to assert a first control signal in response to the common-mode voltage signal being greater than a positive threshold and assert a second control signal in response to the common-mode voltage signal being lower than a negative threshold, and
the logic circuit is configured to receive the first control signal and the second control signal, assert a global control signal in response to the first control signal or the second control signal being asserted, and assert the masking signal for the masking time interval in response to the global control signal being asserted.

3. The receiver circuit of claim 2, wherein the sensing circuit includes:
a voltage monitoring circuit configured to output the common-mode voltage signal by producing an arithmetic average of the differential signal;
a first sensing circuit comparator circuit configured to compare the common-mode voltage signal to the positive threshold to assert and de-assert the first control signal; and
a second sensing circuit comparator circuit configured to compare the common-mode voltage signal to the negative threshold to assert and de-assert the second control signal.

4. The receiver circuit of claim 2, wherein the logic circuit includes:
a first logic gate configured to receive the first control signal and the second control signal, and assert the global control signal in response to the first control signal or the second control signal being asserted;
a time window generating circuit configured to assert the masking signal for the masking time interval in response to the global control signal being asserted, and de-assert the masking signal in response to the masking time interval elapsing;
a second logic gate configured to pass the intermediate set signal when the masking signal is de-asserted and mask the intermediate set signal when the masking signal is de-asserted; and
a third logic gate configured to pass the intermediate reset signal when the masking signal is de-asserted and mask the intermediate reset signal when the masking signal is de-asserted.

5. The receiver circuit of claim 4, wherein:
the first logic gate includes a first OR logic gate configured to apply OR logic processing to the first control signal and the second control signal to output the global control signal;
the second logic gate includes a second OR logic gate configured to apply the OR logic processing to the intermediate set signal and the masking signal to output the corrected set signal; and
the third logic gate includes a third OR logic gate configured to apply the OR logic processing to the intermediate reset signal and the masking signal to output the corrected reset signal.

6. The receiver circuit of claim 1, wherein the output control circuit includes a set-reset flip-flop having a clock input terminal driven by the corrected set signal and a reset input terminal driven by the corrected reset signal, wherein the set-reset flip-flop outputs the digital output signal at a data output terminal of the set-reset flip-flop.

7. The receiver circuit of claim 1, further comprising:
an amplifier circuit configured to receive the differential signal and pass an amplified replica of the differential signal to the first receiver circuit comparator circuit and to the second receiver circuit comparator circuit.

8. The receiver circuit of claim 1, further comprising:
a driver circuit that includes a half-bridge circuit, the half-bridge circuit being arranged between a positive supply voltage pin and a reference supply voltage pin and driven by the digital output signal to produce an output switching signal.

9. An isolated driver device, comprising:
a first semiconductor die and a second semiconductor die, wherein the first semiconductor die includes:
an input pin configured to receive a digital input signal;
a transmitter circuit configured to receive the digital input signal and to output a pair of complementary digital signals, wherein a first one of the complementary digital signals is a replica of the digital input signal and is output at a first output node of the transmitter circuit, and a second one of the complementary digital signals is a complement of the digital input signal and is output at a second output node of the transmitter circuit; and
a galvanic isolation barrier including a first isolation capacitor having a first terminal coupled to the first output node of the transmitter circuit and a second isolation capacitor having a first terminal coupled to the second output node of the transmitter circuit, wherein a differential signal is produced between a second terminal of the first isolation capacitor and a second terminal of the second isolation capacitor, the differential signal including a spike of a first polarity at each rising edge of the digital input signal and a spike of a second polarity at each falling edge of the digital input signal, and
wherein the second semiconductor die includes a receiver circuit including:
a first input node coupled to the second terminal of the first isolation capacitor and a second input node coupled to the second terminal of the second isolation capacitor, wherein the first and second input nodes are configured to receive the differential signal differentially therebetween;
a first receiver circuit comparator circuit configured to receive the differential signal and output an intermediate set signal that includes a pulse at each spike of the differential signal having the first polarity;
a second receiver circuit comparator circuit configured to receive the differential signal and output an intermediate reset signal that includes a pulse at each spike of the differential signal having the second polarity;
a sensing circuit coupled to the first and second input nodes and configured to extract a common-mode voltage signal from the differential signal and to assert at least one control signal in response to an amplitude of the common-mode voltage signal exceeding a threshold value;
a logic circuit configured to:
receive the intermediate set signal, the intermediate reset signal and the at least one control signal;
assert a masking signal for a masking time interval in response to the at least one control signal being asserted, and de-assert the masking signal in response to the masking time interval elapsing;
produce a corrected set signal by passing the intermediate set signal when the masking signal is de-asserted and masking the intermediate set signal when the masking signal is de-asserted, wherein the corrected set signal includes the pulses of the intermediate set signal produced while the masking signal is de-asserted; and
produce a corrected reset signal by passing the intermediate reset signal when the masking signal is de-asserted and masking the intermediate reset signal when the masking signal is de-asserted, wherein the corrected reset signal includes the pulses of the intermediate reset signal produced while the masking signal is de-asserted; and
an output control circuit configured to:
receive the corrected set signal and the corrected reset signal; and
assert a digital output signal in response to a pulse being detected in the corrected set signal and de-assert the digital output signal in response to a pulse being detected in the corrected reset signal.

10. An electronic system, comprising:
a processor configured to generate the digital input signal; and
the isolated driver device according to claim 9.

11. The isolated driver device of claim 9, wherein:
the sensing circuit is configured to assert a first control signal in response to the common-mode voltage signal being greater than a positive threshold and assert a second control signal in response to the common-mode voltage signal being lower than a negative threshold, and
the logic circuit is configured to receive the first control signal and the second control signal, assert a global control signal in response to the first control signal or the second control signal being asserted, and assert the masking signal for the masking time interval in response to the global control signal being asserted.

12. The isolated driver device of claim 11, wherein the sensing circuit includes:
a voltage monitoring circuit configured to output the common-mode voltage signal by producing an arithmetic average of the differential signal;
a first sensing circuit comparator circuit configured to compare the common-mode voltage signal to the positive threshold to assert and de-assert the first control signal; and
a second sensing circuit comparator circuit configured to compare the common-mode voltage signal to the negative threshold to assert and de-assert the second control signal.

13. The isolated driver device of claim 11, wherein the logic circuit includes:
a first logic gate configured to receive the first control signal and the second control signal, and assert the global control signal in response to the first control signal or the second control signal being asserted;
a time window generating circuit configured to assert the masking signal for the masking time interval in response to the global control signal being asserted, and de-assert the masking signal in response to the masking time interval elapsing;
a second logic gate configured to pass the intermediate set signal when the masking signal is de-asserted and mask the intermediate set signal when the masking signal is de-asserted; and
a third logic gate configured to pass the intermediate reset signal when the masking signal is de-asserted and mask the intermediate reset signal when the masking signal is de-asserted.

14. The isolated driver device of claim 13, wherein:
the first logic gate includes a first OR logic gate configured to apply OR logic processing to the first control signal and the second control signal to output the global control signal;
the second logic gate includes a second OR logic gate configured to apply the OR logic processing to the intermediate set signal and the masking signal to output the corrected set signal; and
the third logic gate includes a third OR logic gate configured to apply the OR logic processing to the intermediate reset signal and the masking signal to output the corrected reset signal.

15. The isolated driver device of claim 9, wherein the output control circuit includes a set-reset flip-flop having a clock input terminal driven by the corrected set signal and a reset input terminal driven by the corrected reset signal, wherein the set-reset flip-flop outputs the digital output signal at a data output terminal of the set-reset flip-flop.

16. The isolated driver device of claim 9, wherein the receiver circuit further includes:
an amplifier circuit configured to receive the differential signal and pass an amplified replica of the differential signal to the first receiver circuit comparator circuit and to the second receiver circuit comparator circuit.

17. The isolated driver device of claim 9, wherein the receiver circuit further includes:
a driver circuit that includes a half-bridge circuit, the half-bridge circuit being arranged between a positive supply voltage pin and a reference supply voltage pin and driven by the digital output signal to produce an output switching signal.

18. A method of decoding a differential signal into a digital output signal, the method comprising:
receiving a differential signal that includes spikes of a first polarity and spikes of a second polarity;
producing an intermediate set signal that includes a pulse at each spike of the differential signal having the first polarity;
producing an intermediate reset signal that includes a pulse at each spike of the differential signal having the second polarity;
extracting a common-mode voltage signal from the differential signal;
asserting at least one control signal in response to an amplitude of the common-mode voltage signal exceeding a threshold value;
asserting a masking signal for a masking time interval in response to the at least one control signal being asserted, and de-asserting the masking signal in response to the masking time interval elapsing;
producing a corrected set signal by passing the intermediate set signal when the masking signal is de-asserted and masking the intermediate set signal when the masking signal is de-asserted;
producing a corrected reset signal by passing the intermediate reset signal when the masking signal is de-asserted and masking the intermediate reset signal when the masking signal is de-asserted; and
asserting the digital output signal in response to a pulse being detected in the corrected set signal and de-asserting the digital output signal in response to a pulse being detected in the corrected reset signal.

19. The method of claim 18, further comprising:
asserting a first control signal in response to the common-mode voltage signal being greater than a positive threshold and asserting a second control signal in response to the common-mode voltage signal being lower than a negative threshold; and
asserting a global control signal in response to the first control signal or the second control signal being asserted, and asserting the masking signal for the masking time interval in response to the global control signal being asserted.

20. The method of claim 19, further comprising:
outputting the common-mode voltage signal by producing an arithmetic average of the differential signal;
comparing the common-mode voltage signal to the positive threshold to assert and de-assert the first control signal; and
comparing the common-mode voltage signal to the negative threshold to assert and de-assert the second control signal.

* * * * *